Dec. 19, 1961 H. V. MAY ET AL 3,014,195

CAPACITOR TERMINAL AND MOUNTING ARRANGEMENT

Filed April 21, 1958

INVENTORS
HAROLD V. MAY
HARRY KALKER

BY Connolly and Hutz

ATTORNEYS 3,014,195
Patented Dec. 19, 1961

3,014,195

CAPACITOR TERMINAL AND MOUNTING ARRANGEMENT

Harold V. May, Pittsfield, and Harry Kalker, Williamstown, Mass., assignors to Sprague Electric Company, North Adams, Mass., a corporation of Massachusetts Filed Apr. 21, 1958, Ser. No. 729,669
5 Claims. (Cl. 339—131)

This invention relates to a universal terminal and mounting arrangement for replacement capacitors, and more particularly relates to such an arrangement for mounting replacement capacitors either upon chassis or upon printed circuit boards.

It is a rather simple matter to provide a means for mounting a capacitor upon any specific chassis or printed circuit board. Specially designed projections and corresponding apertures can easily be respectively provided upon the capacitor and the chassis or printed circuit board upon which it is to be mounted. Each manufacturer of electronic equipment usually specifically designs its chassis or circuit board for use to accommodate a particular type of capacitor mounting and terminal arrangement. If this capacitor should for any reason fail under service and require replacement, it can be readily replaced only by the same type of capacitor that was originally installed. However, it is advantageous for a manufacturer of capacitors to have its products adaptable for use in replacing equivalently rated capacitors regardless of their specific form of mounting and terminal arrangement.

An object of this invention is to provide a terminal and mounting arrangement for a capacitor which facilitates its use as a replacement for equivalently rated capacitors regardless of their particular terminal and mounting arrangement.

In accordance with this invention, an array of prongs having enlarged bases and elongated ends extends downwardly from the mounting ring of the capacitor. One of these prongs is smooth sided for indexing purposes, and the other include small barbs at their lower ends. The bases of these prongs are made narrow enough in conjunction with their spacing to fit within a wide range of chassis mounting holes, and deformable ears are disposed adjacent these bases which are constructed and arranged to permit them to be twisted under a chassis to lock the bases within these mounting holes. Furthermore, these enlarged bases provide means for maintaining the capacitor resting evenly above a printed circuit board when the elongated ends of these prongs are inserted through it.

An array of capacitor section terminals extends downwardly from the capacitor within the mounting ring. These terminals include thin elongated stems with enlarged ends incorporating means for lashing leads thereto. When the capacitor is installed in a printed circuit board, the enlarged heads are cut off which permits the barbed prongs and stems to be inserted through the relatively small holes in a printed circuit board for connection to the circuit incorporated therein.

Novel features and advantages of the present invention will become apparent to one skilled in the art from a reading of the following description in conjunction with the accompanying drawings wherein similar reference characters refer to similar parts and in which:

FIG. 1 is a perspective view of an embodiment of this invention mounted upon a chassis;

FIG. 1*a* is a perspective view of a portion of the embodiment shown in FIG. 1;

Figure 1:
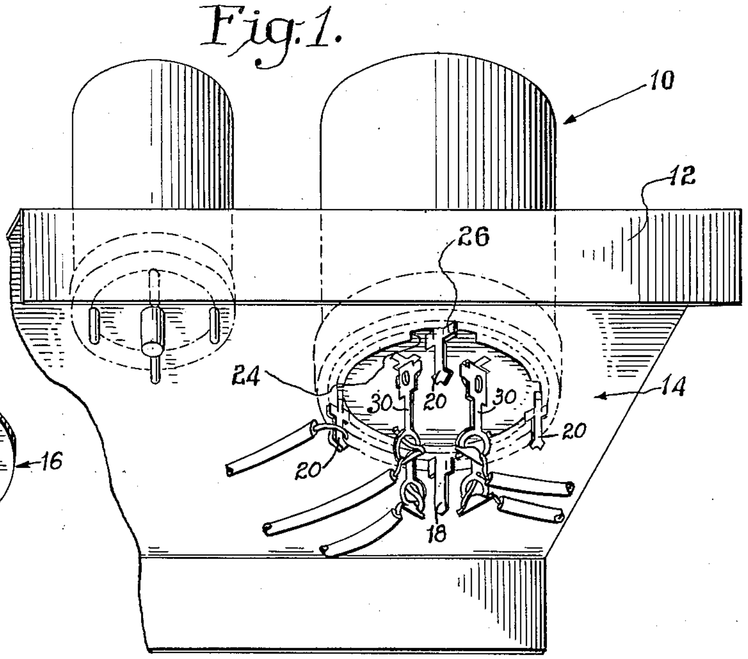
Figure 1A:
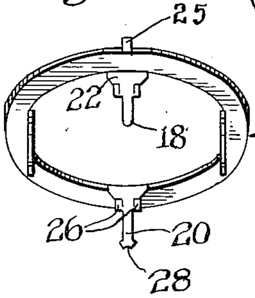
Figure 2:
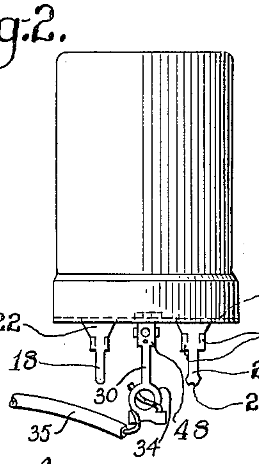
FIG. 2 is a view in elevation of the embodiment shown in FIG. 1.

In FIG. 1 is shown a capacitor 10 which is mounted, for example, upon a sheet metal chassis 12 by a terminal and mounting arrangement 14. As shown in FIGS. 1, 1*a*, and 2, terminal and mounting arrangement 14 includes a mounting ring 16 having a smooth-sided indexing prong 18 and an array of barbed prongs 20 extending downwardly from its base. The bases 22 of these prongs are narrow enough and disposed in positions about the circumference of ring 16 to permit them to fit within a wide range of mounting slots 24 provided for mounting standard capacitors within holes in a chassis. A lug 25 projects upwardly from ring 16 to provide a means for locking ring 16 in proper orientation to the body of the capacitor and the section tabs. This locking also prevents twisting of the section tabs and attached terminals which are later described.

Deformable ears 26 are provided upon prongs 18 and 20 adjacent bases 22. These ears are partially separated from the stems of prongs 18 and 20, for example, during the punching operation which forms them to permit them to be twisted, as shown in FIG. 1, to be bent under sheet metal chassis 12 adjacent slots 24 to lock the bases and attached capacitors to the chassis.

Relatively small barbs 28 are provided at the lower ends of barbed prongs 20 to provide a means for lashing leads in the ground circuit including barbed prongs 20. The mounting ring and barbed prongs 20 are conventionally electrically connected to the common cathode of the capacitors which is generally connected to the ground circuit of the chassis. Barbs 28, therefore, provide a means for conveniently connecting leads to the ground circuit.

Figure 4:
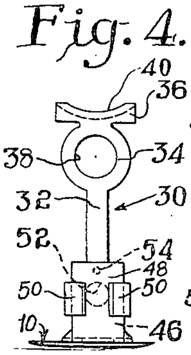
FIG. 4 is a view in elevation of a portion of the embodiment shown in FIGS. 1–3.
Figure 5:
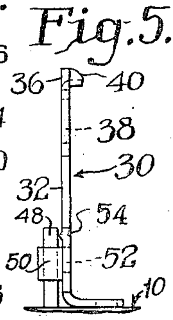
FIG. 5 is a side view in elevation of the portion shown in FIG. 4.
Figure 6:
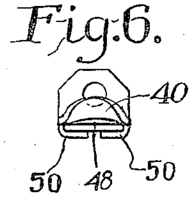
FIG. 6 is a top plan view of the portion shown in FIG. 4.

An array of capacitor section terminals 30 extends downwardly from the capacitor within the mounting ring. These terminals, as shown in FIGS. 4–6, each include a thin elongated stem 32 and an enlarged end 34 which incorporates a means for lashing leads 35 thereto as shown in FIG. 2. End 34 is, for example, a ring 34 joined by an indented bar 36. The hole 38 in ring 34 and the indentation 40 in indented bar 36 provide convenient means for lashing a lead to terminal 30 prior to soldering thereto.

Figure 3:
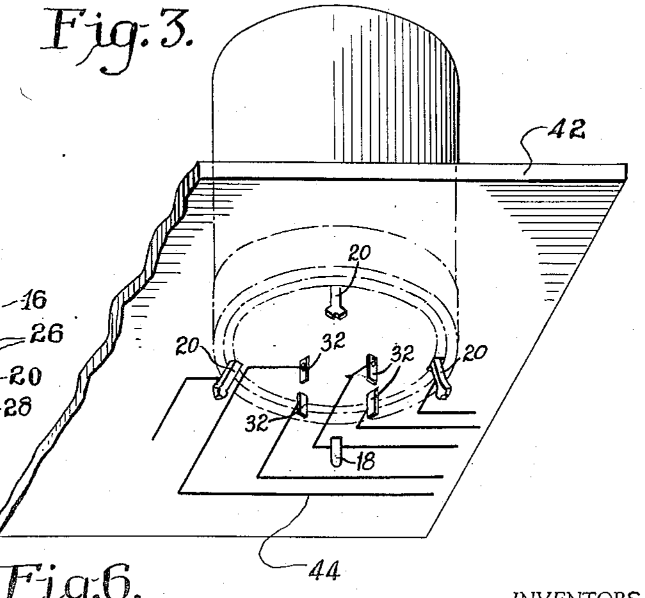
FIG. 3 is a perspective view of an embodiment of this invention mounted upon a printed circuit board.

Lashing rings 34 may easily be cut off thin elongated stems 32 to permit terminals 30 to be inserted through holes in a printed circuit board 42 for connection to respective printed circuit elements 44, as shown in FIG. 3. With rings 34 cut off, terminals 30 are approximately the same length as prongs 18 and 20 which is highly advantageous for installation work on printed circuit boards. Stems 32 and prongs 18 and 20 are bent slightly apart after insertion into the printed circuit board 42, to help anchor the capacitor to the board with capacitor 10 resting evenly a short distance above the board upon ears 26 attached to bases 22 of prongs 16 and 18.

The backs of some printed circuit boards are so covered with circuitry that a full set of passageways for a complete set of four prongs cannot be accommodated. The thin stems of one or more of prongs 20 are, therefore, cut off adjacent ears 26 to permit capacitor 10 to rest evenly upon a full set of ears 26 of prongs 18 and 20.

Base portions 46 of terminals 30 which are disposed adjacent capacitors 10 are enlarged to provide means for connecting terminals 30 to the section tabs 48 of capacitor 10. Bases 46 are, for example, substantially rectangular and include curved ears 50 which overlie a cutout 52, for example, centrally disposed in base 46. After a tab 48 is inserted through curved ears 50, they are deformed over it which forces a portion of the tab into cutout 52 helping to securely anchor the tab 48 to a terminal 30.

Furthermore, a relatively small dimple 54 is formed in the surface of base 46 extending towards an inserted tab 48. This dimple provides a means for localizing the heating effect when a tab is welded to the terminal.

What is claimed is:

1. A mounting base for a capacitor comprising a ring having an outside diameter substantially equal to the diameter of said capacitor, securing means connecting said ring to the bottom of said capacitor, an array of prongs each including a thin stem extending from a relatively wider base section which depends from said mounting ring to form a shoulder between said stem and said base section, an array of capacitor section terminals extending downwardly from said capacitor within said mounting ring, said terminals including thin elongated stems and enlarged ends, said base being adapted for mounting said capacitor upon a chassis including a slotted hole having a diameter in the order of the diameter of said base by insertion of said base sections of said prongs within its slots and projection of said section terminals through said hole to have their enlarged ends provide means for lashing leads to said section terminals, said base being adapted for mounting upon a printed circuit board including a number of relatively small apertures for individually receiving said capacitor section terminals and said prongs by supporting said capacitor above said board upon said shoulders of said prongs when said thin stems of said prongs and said elongated stems of said section terminals are inserted through said apertures after said enlarged ends of said section terminals are cut off, the parts of said elongated stems of said section terminals adjacent said enlarged ends being thin enough to facilitate the cutting off of said enlarged ends, and portions of said prongs being deformable for engagement with said chassis or said printed circuit board for alternatively securing said capacitor to them.

2. An arrangement as set forth in claim 1 wherein said capacitor includes tabs extending outwardly through its base from its sections, said capacitor section terminals are enlarged adjacent their bases for connection to said tabs of said capacitor, said enlarged bases of said terminals being centrally cut out and including deformable curved ears overlapping said cutout portion to provide means for securely anchoring said terminals to said tabs.

3. An arrangement as set forth in claim 1 wherein said stems of said prongs are adapted to be deformed under said printed circuit board for locking said capacitor thereto.

4. An arrangement as set forth in claim 1 wherein a portion of said wider base sections of said prongs are separated a predetermined distance from the base of said capacitor to permit said portion to be deformed under said chassis for locking said capacitor thereto.

5. An arrangement as set forth in claim 4 wherein said portions of said wider base sections of said prongs are separated on both sides of said elongated ends of said prongs to provide a pair of deformable ears for locking said prongs under said chassis.

References Cited in the file of this patent

UNITED STATES PATENTS

| | | |
|---|---|---|
| 1,229,700 | Auel | June 12, 1917 |
| 2,263,539 | Grush | Nov. 18, 1941 |
| 2,569,925 | Deeley | Oct. 2, 1951 |
| 2,825,881 | Del Camp | Mar. 4, 1958 |
| 2,857,582 | Wintriss | Oct. 21, 1958 |
| 2,869,107 | Engel | Jan. 13, 1959 |